(12) United States Patent
Checka

(10) Patent No.: US 9,609,234 B1
(45) Date of Patent: Mar. 28, 2017

(54) CAMERA MODULE AND OPERATING METHOD

(71) Applicant: Neal Checka, Waltham, MA (US)

(72) Inventor: Neal Checka, Waltham, MA (US)

(73) Assignee: VECNA TECHNOLOGIES, INC., Cambridge, MA (US)

( * ) Notice: Subject to any disclaimer, the term of this patent is extended or adjusted under 35 U.S.C. 154(b) by 23 days.

(21) Appl. No.: 14/582,425

(22) Filed: Dec. 24, 2014

(51) Int. Cl.
   H04N 5/247 (2006.01)
   H04N 5/225 (2006.01)
   H01L 27/146 (2006.01)

(52) U.S. Cl.
   CPC ....... H04N 5/247 (2013.01); H01L 27/14618 (2013.01); H04N 5/2252 (2013.01); H04N 5/2257 (2013.01)

(58) Field of Classification Search
   None
   See application file for complete search history.

(56) References Cited

U.S. PATENT DOCUMENTS

| | | | | |
|---|---|---|---|---|
| 6,924,838 B1* | 8/2005 | Nieves | ............... | H04N 5/2251 348/143 |
| 7,298,969 B2* | 11/2007 | Elberbaum | ............ | F16M 11/18 348/373 |
| 7,453,509 B2* | 11/2008 | Losehand | ............... | H01L 24/97 257/E31.117 |
| 8,253,777 B2* | 8/2012 | Lin | ...................... | H04N 5/2258 348/36 |
| 9,036,001 B2* | 5/2015 | Chuang | ............ | G08B 13/19602 348/335 |
| 9,071,767 B2* | 6/2015 | Sasagawa | .............. | H04N 5/247 |
| 9,152,019 B2* | 10/2015 | Kintner | ................ | G03B 17/561 |
| 9,188,839 B2* | 11/2015 | Rodriguez | ............ | G03B 15/03 |
| 2004/0048507 A1* | 3/2004 | Hage | ................ | G08B 13/19619 439/332 |
| 2004/0212677 A1* | 10/2004 | Uebbing | ................ | H04N 7/181 348/155 |
| 2005/0207487 A1* | 9/2005 | Monroe | ........... | G08B 13/19628 375/240.01 |
| 2006/0125921 A1* | 6/2006 | Foote | .................... | G06T 3/4038 348/159 |
| 2007/0206945 A1* | 9/2007 | DeLorme | ............... | G03B 41/00 396/332 |
| 2007/0295893 A1* | 12/2007 | Olsen | ................ | H01L 27/14634 250/226 |

(Continued)

Primary Examiner — Michael Osinski
(74) Attorney, Agent, or Firm — Albert J. Brunett

(57) ABSTRACT

A completely self-contained camera module and operating method are provided. The camera module includes a housing member for mounting to a desired surface, an internal support structure positioned within the housing, and at least two cameras secured to the support structure. Each camera has a field of view to an exterior of the housing. The support structure being operably configured to be readily securable to and removable from the housing so that the support structure and cameras can easily be installed during manufacturing to at least reduce manufacturing variability and so that, if a module is not working in the field, an operator can at least readily replace the support structure and cameras as desired with a different support and cameras in the field without requiring tools and without needing to locate and replace a specific malfunctioning camera.

7 Claims, 4 Drawing Sheets

(56) References Cited

U.S. PATENT DOCUMENTS

| | | | |
|---|---|---|---|
| 2008/0219654 A1* | 9/2008 | Border | H04N 5/2258 396/89 |
| 2010/0053414 A1* | 3/2010 | Tamaki | G01C 3/085 348/340 |
| 2011/0128349 A1* | 6/2011 | Theobald | H04N 5/23238 348/36 |
| 2012/0154521 A1* | 6/2012 | Townsend | H04N 5/247 348/36 |
| 2012/0242788 A1* | 9/2012 | Chuang | G08B 13/19602 348/36 |
| 2012/0242837 A1* | 9/2012 | Sasagawa | H04N 5/247 348/159 |
| 2014/0160274 A1* | 6/2014 | Ishida | G01S 19/14 348/113 |
| 2014/0267596 A1* | 9/2014 | Geerds | H04N 5/2252 348/38 |
| 2014/0362224 A1* | 12/2014 | Cao | H04N 5/2252 348/151 |
| 2016/0006911 A1* | 1/2016 | Kimura | H04N 5/2253 348/47 |

* cited by examiner

CAMERA MODULE AND OPERATING METHOD

BACKGROUND OF THE INVENTION

Field of the Invention

The present invention relates generally to completely self-contained camera modules and methods of operating completely self-contained camera modules.

Background Information

Completely self-contained camera modules and the like may include a housing with cameras for providing views about an exterior of the housing. Often times, however, at least one of the cameras may need to be replaced which may be a time consuming and difficult task.

SUMMARY OF THE INVENTION

A completely self-contained camera module and operating method are provided. The camera module includes a housing member for mounting to a desired surface, an internal support structure positioned within the housing, and at least two cameras secured to the support structure. Each camera has a field of view to the exterior of the housing. The support structure is operably configured to be readily securable to and removable from the housing so that the support structure and cameras can easily be installed during manufacturing to at least reduce manufacturing variability and so that if a module is not working in the field an operator can at least readily replace the support structure and cameras as desired with a different support and cameras in the field without requiring tools and without needing to locate and replace a specific malfunctioning camera.

DESCRIPTION OF THE DRAWINGS

The following detailed description will be better understood when read in conjunction with the appended drawings, in which there is shown one or more of the multiple embodiments of the present disclosure. It should be understood, however, that the various embodiments of the present disclosure are not limited to the precise arrangements and instrumentalities shown in the drawings.

DESCRIPTION OF THE PREFERRED EMBODIMENTS

Figure 1:
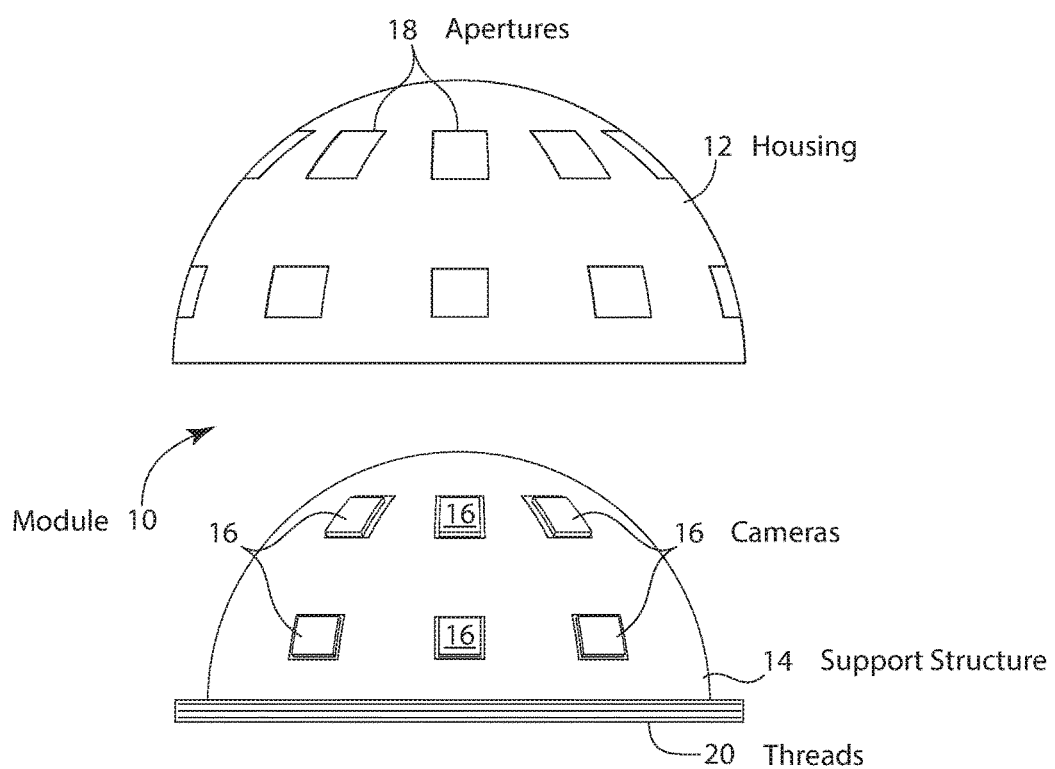
FIG. 1 generally illustrates an exploded view of a camera module in accordance with one embodiment of the invention.

The present invention will be described in detail with reference to embodiments that represent examples of the present invention and are not intended to limit the scope of the invention. Although specific elements and configurations are described to provide an understanding of the invention, it is to be understood that the specific embodiments, elements and configurations provided are for illustrative purposes only. Other configurations will be recognized by those of ordinary skill in the art without departing from the teachings of the present invention or the scope of the appended claims.

Certain terminology is used herein for convenience only and is not to be taken as a limitation on the present disclosure. In the drawings, the same reference letters are employed for designating the same elements throughout the figures.

The present invention is generally related to a completely self-contained camera module and operating method. The module in accordance with the invention may be positioned on a variety of entities such as a person (e.g., a person's helmet), an autonomous, semi-autonomous or non-autonomous robot or vehicle such as a car, van, truck, boat, motorcycle, scooter, trailer, train, plane, drone, aerial vehicle, submersible vehicle or any other type of vehicle or entity to gather views about the entity. The application may of course vary depending on the intended use of the module.

For example, the module may be used as a security camera device in stores, streets, government buildings, private residences, commercial buildings, bus stations, train stations, airports, academic buildings, or the like. This list is non-exhaustive and Applicant expressly contemplates that the features of the invention may be used in a wide variety of additional applications.

FIG. 1 generally illustrates an exploded view of a completely self-contained camera module 10 in accordance with one embodiment of the invention. In accordance with this embodiment, the module 10 may include a housing member 12 (hereinafter "housing") for mounting to a desired surface, an internal support structure 14 positioned within the housing 12, and at least two cameras 16 secured to the support structure 14 (several cameras 16 are illustrated), where each camera 16 has a field of view to the exterior of the housing 12.

Briefly, in operation, the housing 12 may at least protect the support structure 14 and the cameras 16 from external factors such as debris, weather, projectiles, vandalism, weaponry, or the like. The support structure 14 may support or otherwise mount the cameras 16, and the cameras 16 may gather views about the exterior of the housing 12 such as a hemispheric, 180 degree view about the housing 12.

If the module 10 is not working properly (e.g., the support structure 14 or any of cameras 16 are damaged, malfunctioning, or otherwise inoperable), acquiring certain views about the housing 12 may be difficult if not impossible. In this scenario, an operator may remove the support structure 14 (and therefore the cameras 16 secured to the support structure 14) from the housing 12.

An operator may then insert a different support structure 14 with a different set of cameras 16 into the housing 12. This removal and insertion of support structures and cameras can readily be done in the field to therefore prevent module downtime. The operator may then discard the old, removed support structure or may later diagnose and repair.

There may be little financial incentive to keep the cameras 16 that are secured to the support structure 14 as the cost of cameras has decreased over the past several years. By removing and replacing an entire support structure 14 (including the cameras 16), an operator is not burdened with the time consuming task of determining which specific camera may be malfunctioning or otherwise need replacing. This may be important in scenarios in which an operator may need to maintain views about an entity without significant interruption or delay.

The features of the present invention may also allow for the support structure and the cameras to be easily installed during manufacturing. Specifically, the features of the invention may allow for reduced manufacturing variability between modules and allow the modules to quickly be assembled. This manufacturing flexibility provides significant cost reductions since modules do not need to be custom manufactured from scratch per customer. Rather, a universal platform is provided where the details of the support structure can be customized per customer based on their particular needs.

The unique shape and size of the module 10 itself enables a number of beneficial features. These features, among others, include overlapping fields of view for multiple redundancy, a direct camera view for virtually every direction, unobtrusive and inconspicuous operation to resist or eliminate being blocked, detected and/or disabled, and substantially oblique surfaces that, combined with the material of the module 10, can resist disablement from a foreign object, other types of vandalism or the like.

The housing 12 may include apertures 18 (one each for each camera where the fields of view of each camera are through a respective aperture) and can be a substantially hemispherical member with a desired thickness and can be formed from any desired material such as plastic or metal (including steel or titanium, for example) or the like as well as a variety of composite materials, including any type of bullet resistant or bullet proof materials such as Kevlar material, Lexan material or the like so long as the module 10 functions as desired. The housing 12 may also be used in outdoor environments by making it water resistant or waterproof by making it completely sealed against the environment and may be protected by any type of desired armor. It is to be understood, that the material of the housing 12, or any other elements or features of the housing 12, may vary without departing from the teachings of the present invention or the appended claims.

The housing 12 may be formed of a material such that the cameras 16 have the field of view to the exterior of the housing 12 directly through the housing material. Alternatively, the portions of the housing 12 that align with the cameras 16 can be made of a material that enables the cameras 16 to have the fields of view to the exterior of the housing 12 through the material.

As briefly mentioned above, the housing 12 may also be formed of a plurality of distinct, angled surfaces to at least assist in deflecting projectiles. This concept may be similar as to how aircraft and maritime vessels avoid being detected by radar, for example.

If desired, the module 10 may be completely self-contained with all electronics included inside the housing 12 such as microprocessor(s), data storage, power and external communications such as by any wireless method including Bluetooth, for example. With such a design, all processing of the imagery from the various cameras 16 can be accomplished by the module 10 itself, including stitching together all the various views of the cameras 16 into one data stream to be stored within, or transmitted to the exterior of, the module 10.

Specifically, any of these required electronics may be configured as part of the support structure 14. This enables a high degree of "plug-and-play" operation in which a new support structure 14 (with a new set of cameras 16) may be inserted into the housing 12 to obtain the desired views with minimal calibration or set up.

For example, an operator or user may have access to a plurality of (spare) support structures 14 that may each be pre-configured with the required electronics for processing and communication with a variety external peripheral devices. Each spare support 14 structure may be pre-configured with cameras 16 and able to gather and communicate the desired views once inserted into the housing 12.

Similarly, the support structure 14 may include a power source such as a battery device that can readily be removed and replaced as well. In this scenario, the support structure 14 and cameras 16 may be functional, but the power source may be low on charge. An operator may simply remove the old battery and insert a new battery rather than replacing the support structure 14.

Any necessary power and control elements may also be configured as part of a base portion that may attach to the housing. In this embodiment, the support structure 14 may essentially connect with or otherwise plug into the base portion to receive power and control signals.

The support structure 14 may be readily attached to and removed from the housing 12 by any type of quick connector device, including quick connector devices that do not require any tools. For example, the support structure 14 may be attached to the housing 12 by threads 20 for a screw closure connection, along with various types of spring-lock mechanisms, latches, rails, straps, or any other type of connector device whether available now or invented hereafter. The type of connector device may vary as long as the support structure 14 can readily be secured to and removed from the housing 12, preferably without any tools, and enable the cameras 16 to provide the desired views about the housing 12.

Although the support structure 14 is illustrated in FIG. 1 as a substantially hemispherical portion, the support structure 14 may be configured as any desired shape. For example, the support structure 14 may in the form of a pyramid structure. The exact shape of the support structure 14 may of course vary depending on the application as long as the desired views can be obtained and the features of the invention may be accomplished.

The cameras 16 can be any type of camera, video and/or still, so long as they function as desired, including, but not limited to cameras having a micro lens, miniature and subminiature cameras, fiber optic cameras, CCD cameras, active pixel or CMOS image sensors, or the like including future camera types and styles. Additionally, various software required to "stitch" the various views together is readily available or can be independently developed to fit the particular application.

As readily can be understood from FIG. 1, the fields of view of each camera 16 may be combined to form a hemispherical, panoramic, or "panospheric" view about the housing 12. The views provided may extend up to at least 180 degrees in any direction about the exterior of the housing 12, but may of course vary and be less than 180 degrees.

Figure 2:
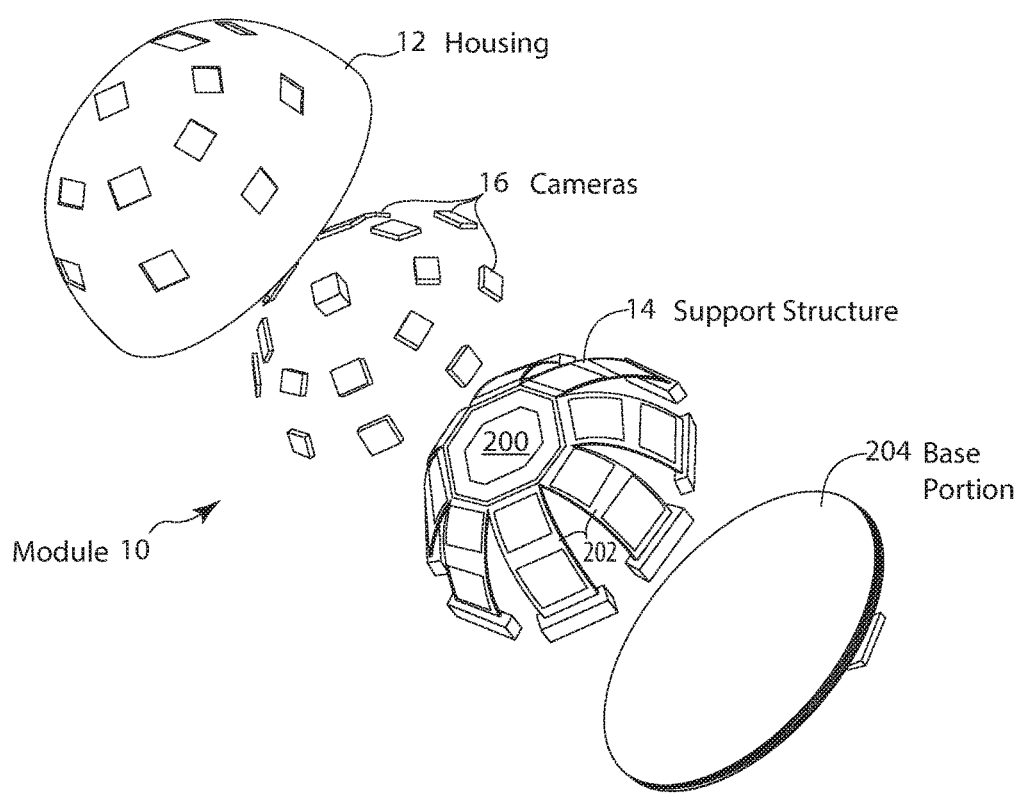
FIG. 2 generally illustrates an exploded view of a camera module in accordance with another embodiment of the invention.

FIG. 2 generally illustrates an exploded view of the module 10 in accordance with another embodiment of the invention. As can generally be seen, the module 10 includes a housing 12, a support structure 14 (defined by a center portion 200 and a plurality of radially extending portions 202), a plurality of cameras 16, and a separate base portion 204. The base portion 204 may at least protect the support structure 14 and the cameras 16, for example.

The base portion 204 and the housing 12 may connect with each other by any type of quick connector device, including quick connector devices that do not require any tools such as those mentioned previously. For example, the base portion 204 and the housing 12 may be connected by various types of spring-lock mechanisms, latches, rails, straps, or any other type of connector device whether available now or invented hereafter.

Or, the housing 12 and the base portion 204 may be configured with a plurality of screw threads (as discussed previously) to connect in a screw closure configuration. The type of connector device may vary as long as the features of the invention may be accomplished.

Figure 3:
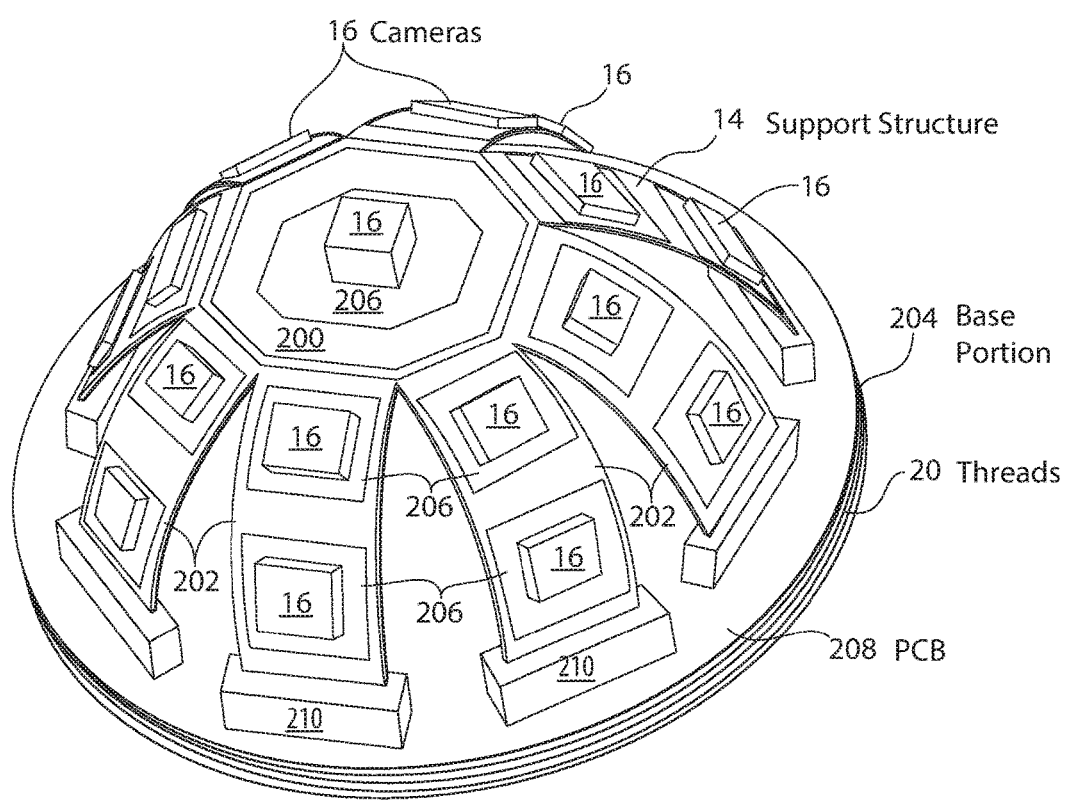
FIG. 3 generally illustrates a support structure in accordance with one embodiment of the invention.

FIG. 3 generally illustrates a perspective view of the support structure 14 positioned on the base portion 204 in accordance with one embodiment of the invention. FIG. 3 also shows a plurality of cameras 16 secured to the support structure 14. In this embodiment, the support structure 14 can be a substantially hemispherical member in the form of a rigid-flex printed circuit board defined by the center portion 200 with the plurality of radially extending portions 202 ("spokes") that extend from the center portion 200 and may support the cameras 16.

The extending portions 202 may allow for two rows of cameras 16. These cameras 16 may be connected with flex circuitry or the like and may be mounted on rigid boards 206 that will also allow for local bypass capacitors to be mounted, if desired.

The support structure 14 may include seventeen (17) cameras 16 in this embodiment. For example, eight cameras 16 can be placed around the horizontal circumference of the support structure 14, and five cameras 16 can be placed around the vertical circumference of the support structure 14.

A ribbon connector or the like may be fabricated at the end of each radially extending portion 202 to connect with a printed circuit board 208 (which may be configured as part of the base portion 204) via zero insertion force (ZIF) electrical connectors 210 or the like. These electrical connectors 210 may contain the power and control signals for the cameras 16 on the respective extending portions 202, and the top camera may share its connections between all extending portions 202. However, any other means for supplying power and control signals may be used as long as the features of the invention can be accomplished.

The module 10 may also include a field programmable gate array (FPGA) and dynamic random-access memory (DRAM) or the like. These components may be used for at least controlling and synchronizing the cameras 16.

The exact type of cameras 16 may vary, and may include cameras with a pixel size of 1.75 μm×1.75 μm which means the raw resolution will be 142 lp/mm. The seventeen cameras of FIG. 3 may produce 5.2 Megapixels of unstitched data per frame for a total data rate of 157 MB/s at 30 FPS. The number of, type of, and characteristics of the cameras 16 may of course vary as long as the features of the invention may be accomplished.

In this embodiment, the printed circuit board 208 may consume roughly 1.7 W and the cameras together may consume 1.7 W for a total estimated power consumption of 3.4 W. Therefore, the module 10 of this embodiment may only require a single USB 3.0 connection for power, control, and data acquisition.

The module 10 in accordance with this embodiment has a hemispheric diameter of roughly 1.14 inches and weighs approximately three (3) ounces. The size and weight of the module 10 may of course vary and may depend on the number and type of components used.

The size of the module 10 may also depend on the particular application. For example, in some situations it may be desirable to have smaller modules so they are more likely remain unnoticed and therefore less at risk of being intentionally (or unintentionally) damaged.

However, the module 10 should not be too small such that replacing the support structure is impractical. For example, operators may be wearing gloves such that handling the module components (i.e., removing/inserting the support structure) would be difficult with smaller components.

Or, operators may be traveling in a vehicle when trying to replace the support structure and handling small components may be difficult due to the vehicle's movement. Therefore the size of the module and its components may vary depending on the application as long as the features of the invention may be accomplished.

Figure 4:
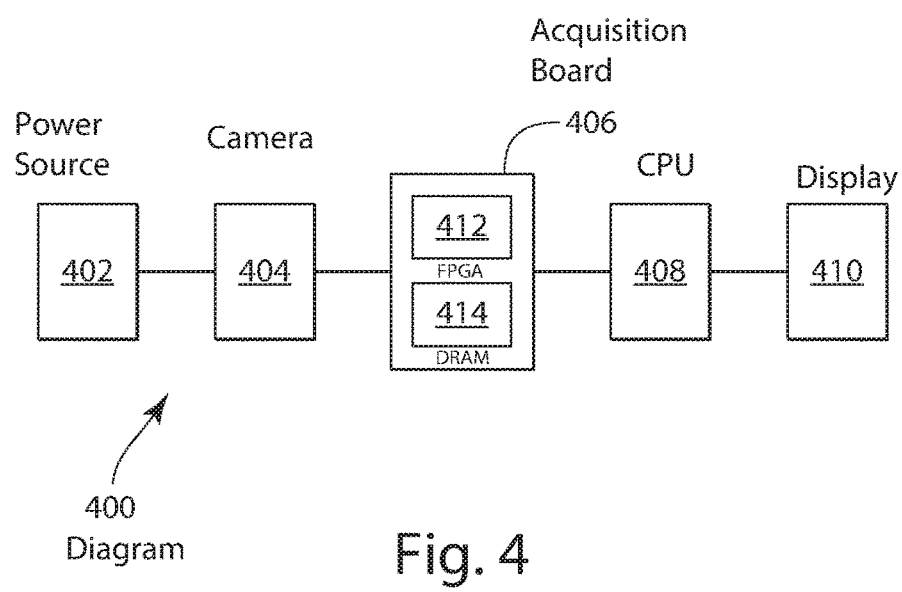
FIG. 4 generally illustrates the connectivity of several module components in accordance with one embodiment of the invention.

FIG. 4 generally illustrates a diagram 400 showing exemplary connectivity of certain components of the module 10. These components may include at least one power source 402, such as a battery or the like, to supply power to other components such as the cameras 404.

The imagery gathered by the cameras 404 may be communicated to a camera acquisition board 406 before being passed onto a computer 408 (e.g., a personal computer or "PC", a tablet computer, a smart phone, etc.) for output on a display device 410. The camera acquisition board 406 may at least transfer interleaved data to the PC 408 for real time or offline analysis.

The camera acquisition board 406 may include a field programmable gate array (FPGA) 412 and dynamic random access memory (DRAM) 414 for controlling the module, including the synchronization of each camera 404. In operation, it is contemplated that processing of the gathered imagery may be performed by the PC 408 (which may include a graphics processing unit or "GPU") or the FPGA 412.

As stated previously, all necessary power, control, and communication elements may be configured as part of the support structure 14, a base portion, or even a combination of the two. These may include the power source 402, bypass capacitors (not shown in FIG. 4), FPGA 412, DRAM 414, along with any communication elements to enable communication with external devices (e.g., via a hardwired or wireless connection).

In addition to the applications and configurations discussed previously, other applications and configurations may implement the features of the invention. These include those described in Applicant's allowed U.S. Pat. No. 8,279,266 entitled "Video System Using Camera Modules to Provide Real-Time Composite Video Image," filed Nov. 30, 2009 and issued Oct. 2, 2012, as well as U.S. Pat. No. 8,446,457, entitled "System for Providing Camera Views," filed Nov. 30, 2009 and issued May 21, 2013, the content of which are hereby incorporated herein by reference in their entirety.

The embodiments of the present disclosure may be implemented with any combination of hardware and software. If implemented as a computer-implemented apparatus, the embodiments of the present disclosure are implemented using means for performing all of the steps and functions described above. The computer-implemented apparatus, for example, may include memory and at least one processing device, which may include one or more single-core and/or multi-core processors. The memory is configured to store software (e.g., program instructions) for execution by the processing device, which software execution may control and/or facilitate performance of one or more operations such as those described in the methods herein. The memory may be a non-transitory computer readable medium such as a volatile memory and/or a nonvolatile memory. The hardware of the computer-implemented apparatus, of course, may also or alternatively include analog and/or digital circuitry other than that described herein.

The embodiments of the present disclosure can be included in an article of manufacture (e.g., one or more computer program products) having, for instance, computer useable media. The media has embodied therein, for example, computer readable program code means for providing and facilitating the mechanisms of the embodiments of the present disclosure. The article of manufacture can be included as part of a computer system or sold separately.

Although the description above contains many specific examples, these should not be construed as limiting the scope of the embodiments of the present disclosure but as merely providing illustrations of the presently preferred embodiment(s) of this disclosure. Thus, the scope of the embodiments of the disclosure should be determined by the appended claims and their legal equivalents, rather than by the examples given.

It will be appreciated by those skilled in the art that changes could be made to the embodiments described above without departing from the broad inventive concept thereof. It is understood, therefore, that this disclosure is not limited to the particular embodiments disclosed, but it is intended to cover modifications within the spirit and scope of the embodiments of the present disclosure.

What is claimed is:

1. A completely self-contained camera module, comprising:
   a housing for mounting to a desired surface;
   an internal support structure positioned within the housing;
   at least two cameras secured to the internal support structure, each camera having a field of view to an exterior of the housing, the internal support structure securable to and removable from the housing so that the internal support structure and the cameras are operable for installation during manufacturing to at least reduce manufacturing variability and so that, when a module is not working in the field, the internal support structure and the cameras are operable for replacement by an operator with a different internal support structure and cameras without requiring tools and without needing to locate and replace a specific malfunctioning camera; and
   further comprising a base that is operably connected to the housing, wherein the base includes power and control elements for supplying power and control signals to the cameras wherein the base includes at least one electrical connection element for receiving the internal support structure and for providing power and control signals to the cameras.

2. The module as defined in claim 1, wherein the housing has at least two apertures, one each for each camera, and the field of view of each camera is through a respective one of the apertures.

3. The module as defined in claim 1, wherein the fields of view of the cameras to the exterior of the housing are directly through the housing material.

4. The module as defined in claim 1, wherein at least the portions of the housing that align with the cameras are made of a material that enables the cameras to have the fields of view to the exterior of the housing.

5. The module as defined in claim 1, further comprising a base that is operably connected to the housing by a quick connector mechanism.

6. The module as defined in claim 1, wherein the internal support structure has a substantially hemispherical shape with a center portion and a plurality of radially extending portions that extend from the center portion and support at least one of the cameras.

7. The module as defined in claim 1, wherein the module includes a readily replaceable battery device.

* * * * *